United States Patent
Rule (10) Patent No.: US 9,069,017 B2
(45) Date of Patent: Jun. 30, 2015

(54) SERIAL BIT STREAM REGULAR EXPRESSION ENGINE

(75) Inventor: Keith D. Rule, Beaverton, OR (US)

(73) Assignee: TEKTRONIX, INC., Beaverton, OR (US)

( * ) Notice: Subject to any disclaimer, the term of this patent is extended or adjusted under 35 U.S.C. 154(b) by 974 days.

(21) Appl. No.: 12/949,703

(22) Filed: Nov. 18, 2010

(65) Prior Publication Data

US 2011/0134979 A1 Jun. 9, 2011

Related U.S. Application Data

(60) Provisional application No. 61/266,966, filed on Dec. 4, 2009.

(51) Int. Cl.
*G01R 13/02* (2006.01)
(52) U.S. Cl.
CPC ................................. *G01R 13/0254* (2013.01)
(58) Field of Classification Search
CPC .... G01R 13/02; G01R 13/0218; G01R 13/22; H04L 63/0435; H04L 43/04
USPC ................. 702/127, 108, 117, 119–120, 176, 702/182–183, 186, 189–190, 193; 365/49.1, 49.17; 375/224–225, 375/227–228; 711/108, 212
See application file for complete search history.

(56) References Cited

U.S. PATENT DOCUMENTS

| 7,797,346 | B2* | 9/2010 | Heuer et al. ................... 707/793 |
| 2006/0245484 | A1 | 11/2006 | Calvin |
| 2007/0047457 | A1* | 3/2007 | Harijono et al. ............... 370/250 |
| 2008/0071765 | A1* | 3/2008 | Ichiriu et al. ...................... 707/5 |
| 2008/0303443 | A1 | 12/2008 | Tran |

FOREIGN PATENT DOCUMENTS

EP 1139103 A1 10/2001

OTHER PUBLICATIONS

Divyasree et al., Dynamically Reconfigurable Regular Expression Matching Architecture, Application-Specific Systems, Architectures and Processors, International Conference on, IEEE, Piscataway, NJ, USA, Jul. 2, 2008, pp. 120-125.*
Mitra et al., Compiling PCRE to FPGA for Accelerating SNORT IDS, Dec. 3-4, 2007, ACM/IEEE Symposium on Architectures for Networking and Communications Systems, Orlando, FL, 9 pp.*
Bonesana et al., An Adaptable FPGA-Based System for Regular Expression Matching, 2008 EDAA, pp. 1262-1267.*
Shakil A. Chunawala, Creatr: A Generic Graphical Distributed Debugger with Language Support for Application Interfacing, Sep. 1994, M.S. Thesis, Department of Electrical Engineering and Computer Science, Massachusetts Institute of Technology, 86 pp.*

(Continued)

*Primary Examiner* — Toan Le
(74) *Attorney, Agent, or Firm* — Marger Johnson & McCollom PC; Thomas F. Lenihan (57) ABSTRACT

A test and measurement instrument including a user interface; and a controller is described. The controller is configured to receive a serial bit stream; apply a regular expression to the serial bit stream; and present acquired data, or other data, through the user interface in response to the application of the regular expression to the serial bit stream.

21 Claims, 4 Drawing Sheets

(56) References Cited

OTHER PUBLICATIONS

Johnson et al., Monitoring Regular Expressions on Out-of-Order Streams, 2007 IEEE, pp. 1315-1319.*

Divyasree J. Rajashekar, et al., "Dynamically Reconfigurable Regular Expression Matching Architecture", Application-Specific Systems, Architectures and Processors, 208, ASAP 2008. International Conference on, IEEE, Piscataway, NJ, USA. Jul. 2, 2008, pp. 120-125, XP031292387, IBSN: 978-1-4244-1897-8 (whole document).

* cited by examiner

SERIAL BIT STREAM REGULAR EXPRESSION ENGINE

CROSS-REFERENCE TO RELATED APPLICATIONS

This application claims priority under 35 U.S.C. §119(e) from U.S. Provisional Application Ser. No. 61/266,966, filed on Dec. 4, 2009, the contents of which are herein incorporated by reference in their entirety.

BACKGROUND

This invention relates to test and measurement instruments and, more particularly, to test and measurement instruments with regular expression processing of serial bit streams.

Regular expressions can be used in analyzing character streams. For example, programs such as Perl and AWK are based on regular expression pattern matching. A regular expression can be used to define a matching sequence of characters. However, such regular expression matching is performed on data that has already been converted into a byte, word, or other multi-bit format. In contrast, serial bit streams are not grouped into such multi-bit formats.

DETAILED DESCRIPTION

This disclosure describes embodiments of a test and measurement instrument with a regular expression engine for a serial bit stream.

Figure 1:
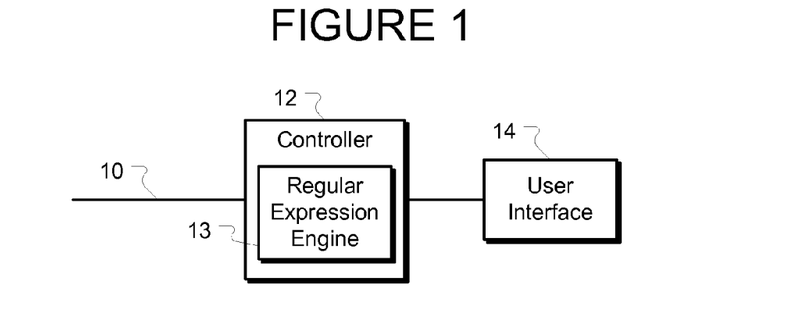
FIG. 1 is a block diagram of a test and measurement instrument with a regular expression engine according to an embodiment of the invention.

FIG. 1 is a block diagram of a test and measurement instrument with a regular expression engine according to an embodiment of the invention. The instrument includes a controller 12 configured to receive a serial bit stream 10. The serial bit stream 10 can be generated in a variety of ways. For example, the instrument can be an oscilloscope configured to digitize an input signal. The digitized input signal, which can be represented as a digitized analog signal, can represent digital data. That is, the digitized input signal can represent a series of bits of a data stream. The serial bit stream 10 can be such a series of bits extracted from the digitized input signal.

In another embodiment, the instrument can be a logic analyzer. The logic analyzer can be configured to compare an input signal to a threshold to generate a serial bit stream for a channel. The serial bit stream 10 can be such a bit stream from a channel of a logic analyzer. Any instrument that can generate a serial bit stream can include a regular expression engine as described herein.

In an embodiment, the serial bit stream 10 can, but need not be acquired immediately before processing by the controller 12. For example, the serial bit stream 10 can be stored in a memory. Such a memory could be an acquisition memory. In another example, the serial bit stream 10 can be stored in a non-volatile memory, such as a disk drive or other mass storage device.

Regardless of the source of the serial bit stream 10, the controller 12 can be configured to receive the serial bit stream 10. The controller 12 can be any variety of circuitry. For example, a digital signal processor (DSP), microprocessor, programmable logic device, general purpose processor, or other processing system with appropriate peripheral devices as desired can be used as the controller 12 to implement the functionality of a regular expression engine 13. Any variation between complete integration to fully discrete components can be used to implement the controller 12. The regular expression engine 13 represents the functionality of the controller 12 to apply a regular expression to the serial bit stream 10.

The controller 12 is coupled to a user interface 14. The user interface 14 can include any variety of interfaces. For example, the user interface 14 can include input interfaces such as buttons, knobs, sliders, keyboards, pointing devices, or the like. The user interface 14 can include output interfaces such as displays, lights, speakers, or the like. The user interface 14 can include input/output interfaces such as communication interfaces, touch screens, or the like. Any variety of user interfaces or combination of such interfaces can be used as the user interface.

The controller 12 can be configured to present acquired data through the user interface in response to the application of the regular expression to the serial bit stream 10. In an embodiment, the acquired data can be the serial bit stream 10 itself. However, in other embodiments, the acquired data and the serial bit stream 10 can be different. For example, as will be described in further detail below, a match in the serial bit stream of a regular expression can be used to trigger other data to be acquired as the acquired data.

The regular expression engine 13 can be used to affect a variety of presentations of the serial bit stream 10. For example, as will be described in further detail below, data can be associated with a regular expression. The data can represent a symbol that was encoded in the matching bit sequence. The serial bit stream 10 can be presented with the symbol as an overlay, the symbol alone, or the like.

In another example, the regular expression engine 13 can be used for searching, marking, or otherwise identifying patterns in the serial bit stream 10, the associated data, or the like. For example, on an oscilloscope, a digitized waveform representing the acquired signal can be searched for a particular bit sequence. The associated sequence of the digitized waveform can be presented through the user interface. Alternatively, the associated sequence can be marked.

In another example, the regular expression engine 13 can be used to filter acquired data. For example, as will be described in further detail below, a regular expression can define a packet structure and matching values that match to only packets from a particular device. The acquisition of data can be filtered so that only matching acquisitions are stored.

In another embodiment, the output of the regular expression engine 13 can be more than mere matches. For example, the serial bit stream 10 can be associated with an acquired digitized waveform. The digitized waveform can be represented as values versus time. When a match is output, additional data, such as the time within the associated digitized waveform can be added to the output. Accordingly, the user interface 14 can be adjusted to reflect the time.

Figure 2:
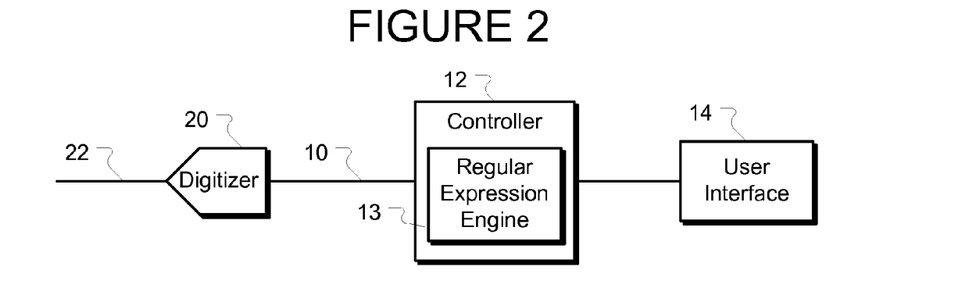
FIG. 2 is a block diagram of the test and measurement instrument of FIG. 1 with digitizer front end according to an embodiment of the invention.

FIG. 2 is a block diagram of the test and measurement instrument of FIG. 1 with digitizer front end according to an embodiment of the invention. The digitizer 20 can be configured to digitize an input signal 22 to generate the serial data stream 10.

Although not illustrated, each digitizer 26 can have a preamplifier, attenuators, filters, and/or other analog circuitry in the analog channel as needed. Thus, the input signals to the digitizers 26 can be amplified, attenuated, or otherwise filtered before digitization. In addition, the digitizers 26 can be any variety of circuitry that can digitize a signal. For example, the digitizers 26 can include circuitry such as track and hold circuits, A/D converters, de-multiplexer circuits as needed to sample the associated input signals.

Figure 3:
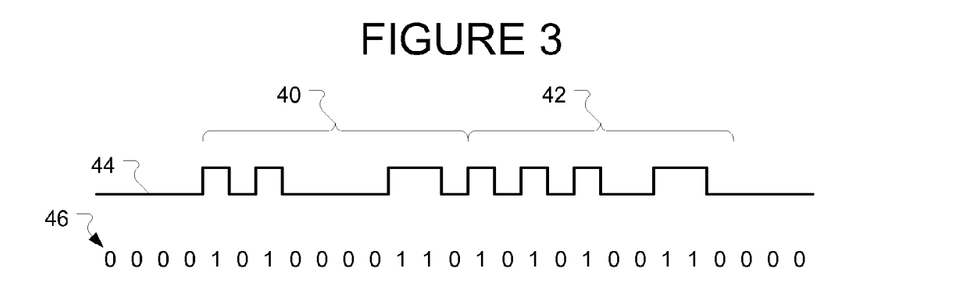
FIG. 3 illustrates a waveform, corresponding bit sequence, and matching bit sequences from a regular expression engine according to an embodiment of the invention.

FIG. 3 illustrates a waveform, corresponding bit sequence, and matching bit sequences from a regular expression engine according to an embodiment of the invention. In an embodiment, a regular expression grammar can be defined as:

| <RegExpr> := | 1 \| 0 \| X |
| | \| <RegExpr> <RegExpr> |
| | \| <RegExpr> \| <RegExpr> |
| | \| <RegExpr> + |
| | \| <RegExpr> * |
| | \| <RegExpr> ? |
| | \| <RegExpr> * INTEGER |
| | \| ( <RegExpr> ) |
| | ; |

In this example, matching bits can be defined as a 1, a 0, or a do-not-care X. A regular expression can be followed by a regular expression. An alternative regular expression can be defined by the OR "|" operator. One or more "+" or zero or more "*" operators can be used to define potentially a repeating regular expression. A "?" operator can mean zero or one of the preceding regular expression. An integer following the "*" operator can mean a repeating number of the regular expression. Parenthesis can be used to group a regular expression or series of regular expressions. Although a particular grammar has been described above, embodiments can use other grammars. In particular, further examples will be given below with other grammars. Furthermore, a grammar used by the regular expression engine 13 can, but need not implement all aspects of the above grammar or the following grammars.

Using the above grammar as an example, a regular expression can be defined for a match. For example, "1010000110" can be defined as a regular expression. A waveform 44 and the corresponding digital values 46 are illustrated in FIG. 3. Bit sequence 40 can be identified as a match as it has the bits "1010000110". However, bit sequence 42 would not match this sequence.

An alternative regular expression can be defined as "1010XX0110". In contrast to the above example, two do-not-care "X" values are included in the regular expression. Thus, both sequences 40 and 42 match the regular expression "1010XX0110".

Figure 4:
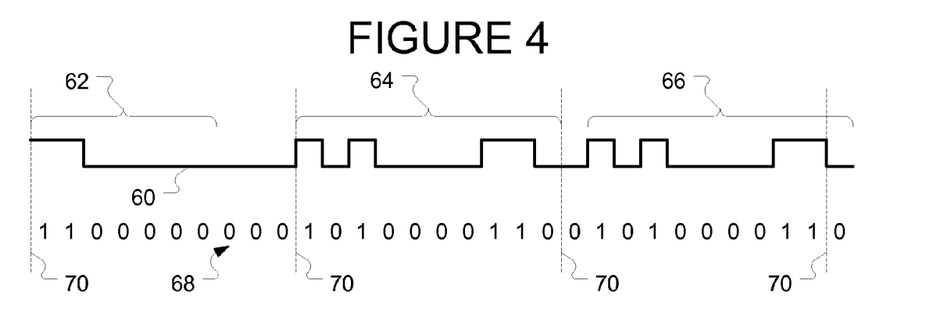
FIG. 4 illustrates a waveform, corresponding bit sequence, matching bit sequences, and an alignment sequence from a regular expression engine according to an embodiment of the invention.

FIG. 4 illustrates a waveform, corresponding bit sequence, matching bit sequences, and an alignment sequence from a regular expression engine according to an embodiment of the invention. In an embodiment, the regular expression engine 13 can be configured to align operations within the serial bit stream 10. For example, an encoding technique such as 8b/10b can define a particular sequence or sequences of bits that can be used for alignment. The sequences "1100000" or "0011111" within an 8b/10b encoding can indicate the 10 bit alignment within the serial bit stream.

A regular expression grammar can be defined to permit expression of such alignment sequences. For example, a regular expression with an alignment expression can be defined as:

| <RegExprWithAlignment>: | <RegExpr> <Alignment> |
| | ; |
| <Alignment>: | width <Expr> |
| | \| alignment <RegExpr> |
| | \| <Alignment> width <Expr> |
| | \| <Alignment> alignment <RegExpr> |
| | ; |

Here, the operator "alignment" can indicate that the following regular expression defines a match for an alignment sequence within the serial bit stream 10. For example, using the above sequences, a regular expression of "alignment (1100000|0011111)" can be used to define either "1100000" or "0011111" as the alignment sequence.

In addition to an alignment sequence, a width can be specified. In this example grammar, the width operation can indicate a number of bits wide a "word" within the serial bit stream 10. For example, within 8b/10b encoding the width can be 10 bits. Accordingly, an alignment expression for 8b/10b encoding can be "alignment (1100000|0011111) width 10".

In particular, the definition of a width allows for alignment regular expression, such as those above, that are narrower or wider than the supplied width. In the above example, the alignment regular expression defines two 7-bit matching sequences with a 10 bit width. Thus, when the regular expression engine 13 increments an index into the serial bit sequence 10, the increment can be by the width. That is, in an embodiment, a regular expression may not be applied to each bit, but rather starting at bits in the serial bit stream 10 aligned according to the alignment regular expression.

Referring to FIG. 4, consider the regular expression "1010000110 alignment (1100000|0011111) width 10". Similar to FIG. 3, a waveform 60 and the corresponding digital values 68 are illustrated. A bit sequence 62 matches the alignment regular expression "(1100000|0011111)". With the defined width, application of the regular expression to the waveform 60 can be performed aligned according to the identified alignment bit sequence 62 and the defined width.

Dashed lines 70 delineate the boundaries of "words" within the waveform 60. In this example, both bit sequences 64 and 66 match the regular expression "1010000110". However, only bit sequence 64 is aligned to the boundaries 70. Thus, only bit sequence 64 and not bit sequence 66 would be a match.

In FIG. 4, a matching bit sequence 64 is illustrated as adjacent the alignment bit sequence 62; however, such proximity is not necessary. For example, in an embodiment, the controller can be configured to search the serial bit stream using the alignment regular expression. Once found, the regular expression engine 13 can be configured to apply a remainder of the regular expression in response to a match of the alignment regular expression. That is, the remainder can be applied aligned within the serial bit stream 10 and according to a defined width.

A match to the remainder of the regular expression may not be found until significantly after the alignment sequence. For example, the alignment bit sequence may have been discarded from an acquisition memory by the time a match to the remainder of the regular expression is found. However, the regular expression engine 13 can still operate aligned to the serial bit stream 10.

In other embodiments, the width can be implicitly defined by the alignment sequence. For example, an alignment regular expression of "alignment (1100000XXX|0011111XXX)" can operate substantially similarly with "alignment (1100000|0011111) width 10". That is, the regular expression engine 13 can be configured to determine that the width of the alignment regular expression is the width of a "word" within the serial bit stream 10.

In an embodiment, an alignment bit sequence may not be known or even exist; however a width may be known. For example, the alignment regular expression can be "width 10". In such a circumstance, an index referencing the serial bit stream 10 can be incremented in response to the width; however, an alignment may need to be determined.

A variety of techniques can be used to determine an alignment within the serial bit stream 10. For example, the regular expression engine 13 can be configured to apply the regular expression to the serial bit stream 10 using a number of indices referencing the serial bit stream 10 equal to a width of the regular expression. That is, the regular expression can be applied for each potential index within the serial bit stream 10 for a given width that would not duplicate an earlier similar alignment. For example, if the width is 10, an index of 0 can be substantially similar to an index of 10. The regular expression can be applied for each potential alignment at the level of granularity defined by the width. The index with the greatest number of matches to the regular expression can be selected as the index to be used.

In another embodiment, other techniques that can indicate an alignment can be used to determine an alignment index to be used with the serial bit stream 10. For example, with 8b/10b encoding a running disparity at the end of a symbol can be limited to a particular range. An offset index within the serial bit stream 10 where the running disparity is within the desired range can be used as the identified index. Although a particular examples of characteristics of the serial bit stream 10 that could be used to identify an offset index into the serial bit stream 10, any characteristic of the serial bit stream 10, the expected format, or the like that can indicate an alignment can be searched for over each of an index within a width to determine an appropriate index.

In an embodiment, a serial bit stream 10 can have a dynamic width. To accommodate the dynamic width, the controller 12 can be configured to search the serial bit stream 10 for a valid pattern. Once a valid pattern is identified, the position of the valid pattern can be used to align the regular expression to the serial bit stream 10.

In another example, the serial bit stream 10 can be decoded and checked for errors. If errors exist, exceed a threshold, or the like, the decoding of the serial bit stream 10 can be performed with another offset. Once an offset is found with a minimum of errors, that offset can be used to align the regular expression to the serial bit stream 10.

Although a variety of ways have been described to determine an alignment and/or a width of a word of a serial bit stream 10, other techniques can be used to obtain such information. In an embodiment, the controller 12 can be configured to receive an index referencing the serial bit stream 10 through the user interface 14. The index can be generated in a variety of ways. For example, a user can supply an offset, width, or both. Such supplied information can be transformed into an index referencing the serial bit stream 10 by the user interface 14, the controller 12, or the like. Using this index, the controller can apply the regular expression to the serial bit stream 10.

In another example, a user can use a cursor position to define an offset index for the serial bit stream 10. The serial bit stream 10 may be presented through the user interface 14. A user can manipulate a cursor, whether manually, through some automated function, or the like, to indicate a position within the presented serial bit stream 10. In response, the controller 12 can determine a bit index referencing the serial bit stream 10. Thus, in circumstances where an alignment sequence is not available, has not been defined, or the like, a user can still examine data and indicate an alignment within the serial bit stream 10.

Figure 5:
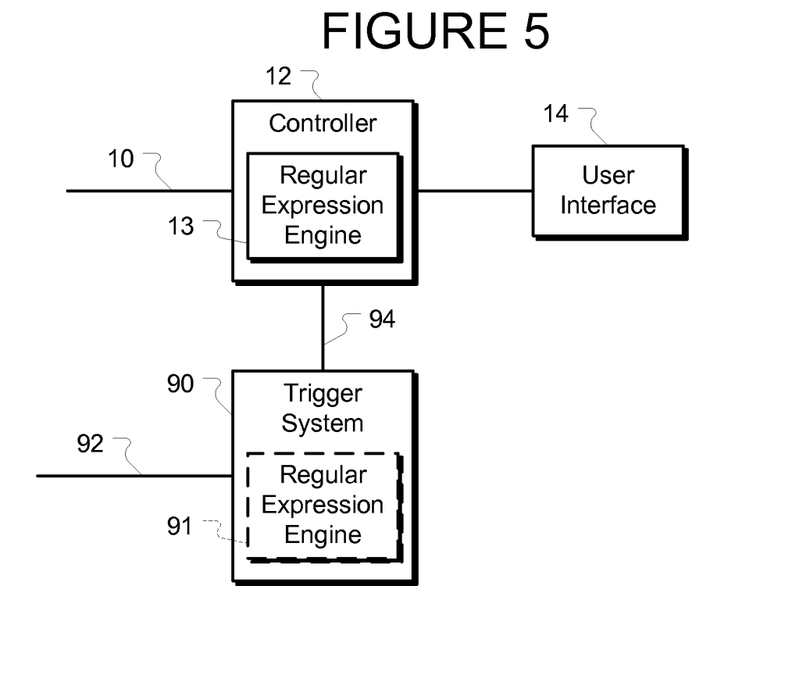
FIG. 5 is a block diagram of a test and measurement instrument with trigger system having a regular expression engine according to an embodiment of the invention.

FIG. 5 is a block diagram of a test and measurement instrument with trigger system having a regular expression engine according to an embodiment of the invention. The trigger system 90 can be configured to generate a trigger signal 94 in response to a trigger input 92. In an embodiment, the controller 12 can be configured to apply a regular expression with the regular expression engine 13 to the serial bit stream in response to the trigger signal 94.

For example, the controller 12 can be configured to use an index referencing the serial bit stream 10 associated with the trigger signal 94. The controller 12 can be configured to receive the trigger signal 94 from a trigger system 90. A bit of the serial bit stream 10 associated in time with the trigger signal 94, a bit at a particular offset from the trigger signal 94, or the like can be used as an alignment indicator for processing of the regular expression. Once alignment is established, the regular expression can be applied as described above.

In another embodiment, the trigger system 90 can have a regular expression engine 91. The regular expression engine 91 can be configured to apply a regular expression to a trigger input 92. In this example, the trigger input 92 can be a serial bit stream. Using the example described above, the regular expression can be "(1100000|0011111)". The trigger input 92 can be analyzed by the regular expression engine for a match. The trigger signal 94 can be generated in response to the match. In an embodiment, the trigger signal 94 can include an identified time or sample position, the matching expression, alignment information within the serial bit stream in the trigger input 92, the serial bit stream itself, a combination of such information, or the like. Such information can be provided to the controller 12 and used for the regular expression engine 13, used in acquiring data, or as otherwise desired.

As described above, the regular expression engine 13 can apply an associated regular expression to the serial data stream 10 aligned in response to the trigger signal 94. However, in this embodiment, the trigger signal 94 can be generated in response to the regular expression engine 91. As described above, the regular expression applied by the regular expression engine 91 of the trigger system 90 can be the alignment regular expression. Thus, the trigger system 90 can perform the processing to determine an alignment and the controller's 12 regular expression engine 13 can apply another regular expression to determine a match.

Figure 6:
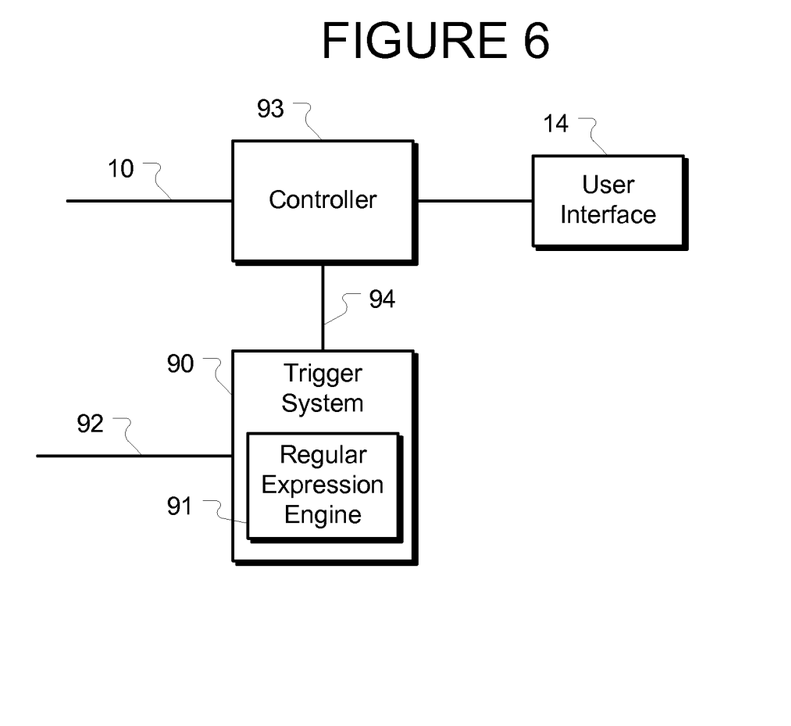
FIG. 6 is a block diagram of a test and measurement instrument with a regular expression engine in a trigger system according to an embodiment of the invention.

FIG. 6 is a block diagram of a test and measurement instrument with a regular expression engine in a trigger system according to an embodiment of the invention. Regular expression engine functionality can be distributed in a variety of ways. As described above, the regular expression functionality can be distributed across the controller 12 and trigger system 90. In this embodiment, the controller 93 need not have a regular expression engine. The regular expression engine 91 is part of the trigger system 90. The trigger system 90 can be configured to trigger an acquisition in response to a match of the regular expression to a serial bit stream of the trigger signal 92.

In an embodiment, such triggering can be used to acquire data only when a match occurs. For example, the instrument can acquire data from a shared medium. A regular expression can be defined that indicates a particular device, packet, source address, or the like. Accordingly, when signals are received from a matching source, only the corresponding data can be used. For example, a real-time data eye can be generated from such data. By using regular expressions only signals from a desired source can contribute to a data eye.

Figure 7:
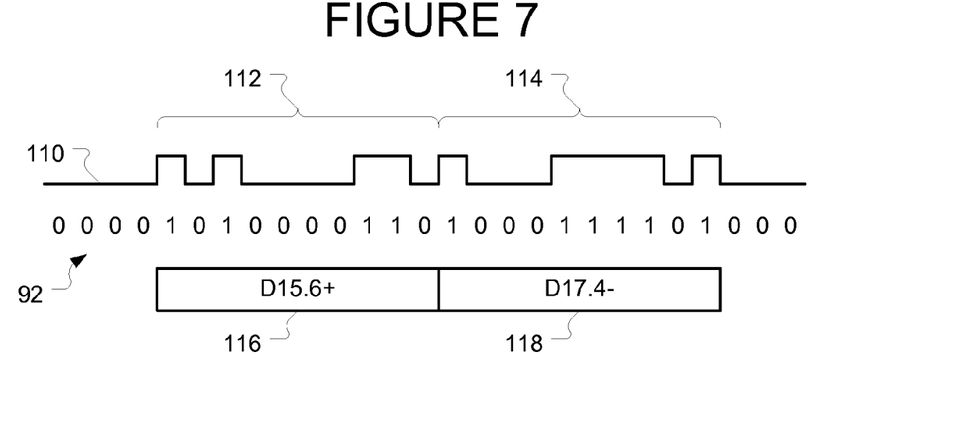
FIG. 7 illustrates a waveform, corresponding bit sequence, matching bit sequences, and associated data from a regular expression engine according to an embodiment of the invention.

FIG. 7 illustrates a waveform, corresponding bit sequence, matching bit sequences, and associated data from a regular expression engine according to an embodiment of the invention. In an embodiment, data can be present in a regular expression. For example, the following grammar allows for data to be described:

<RegExprWithData>:<RegExpr>:<Data>

For clarity, the remainder of a regular expression grammar was not listed; however, the regular expression "<RegExprWithData>" can be used as any regular expression "<RegExpr>" described herein.

In one example, a regular expression "(1010000110: "D15.6+")" can associate the bit sequence "1010000110" with data "D15.6+". A waveform 110 and the corresponding bit sequence 92 are illustrated in FIG. 7. Bit sequence 112 matches "1010000110". Thus, the associated data "D15.6+" can be presented in box 116 through a user interface 14. Similarly, for a regular expression "(1000111101: "D17.4–")", box 118 can present the associated data "D17.4–" through the user interface 14 since bit sequence 114 matches that regular expression.

In an embodiment, using such data associations, a decoder can be implemented. For example, as described above, two bit sequences 112 and 114 were associated with symbols "D15.6+" and "D17.4–". "D15.6+" and "D17.4–" are symbols that are part of an 8b/10b encoding scheme. A regular expression defining the decoder can be defined as "((1000111100: "D17.3")|(1000111101: "D17.4–") . . . (1010000110: "D15.6+")) alignment (1100000|0011111) width 10". In this example, there are numerous other bit sequence to symbol relationships than the three described; however, the three are used as examples. Accordingly, if all of the bit sequences to symbol relationships are defined, then the regular expression can be used to decode the serial bit stream 10. As described above, source waveforms and/or bit streams need not be presented.

In an embodiment, such associated data can be used in subsequent operations of the instrument. For example, the controller can be configured to perform a search based on the data. Using the example above, a search can be performed for "D15.6+" symbols. In an embodiment, the underlying regular expression can, but need not, be hidden from a user. For example, various regular expressions can be predefined for particular symbols, loaded with a test setup, or the like. A user can select the data associated with the regular expression without needing information in the underlying regular expression.

Although text has been used as an example of data that can be associated with a regular expression, other types of information can be used as the data. For example, numbers, expressions, functions, or the like can be part of the associated data.

Figure 8:
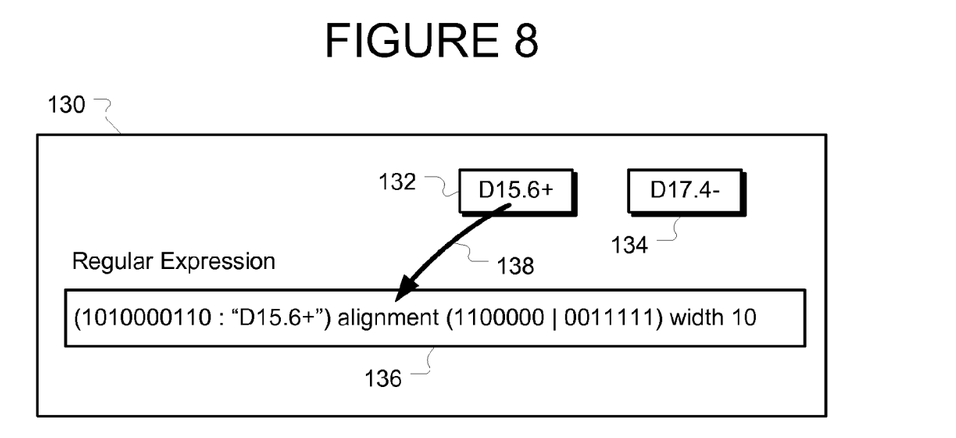
FIG. 8 is an example of a user interface of a test and measurement instrument with a regular expression engine according to an embodiment of the invention.

FIG. 8 is an example of a user interface of a test and measurement instrument with a regular expression engine according to an embodiment of the invention. In an embodiment the user interface 14 can be configured to present a regular expression. In one example, the user interface can be configured to present data of a previously defined regular expression.

Blocks 132 and 134 represent previously defined regular expressions presented in the user interface 130. For example, block 132 can represent the regular expression "(1010000110: "D15.6+") alignment (1100000|0011111) width 10" while block 134 can represent "(1000111101: "D17.4–") alignment (1100000|0011111) width 10"

A user input, such as a drag input of a pointing device is illustrated by arrow 138. Through this input, a user can indicate that an input box 136 for forming a regular expression can be filled in with the regular expression associated with block 132. For example, initially, box 136 could be empty. In response to the user input of arrow 138, box 136 is populated with the regular expression associated with block 132.

However, the regular expression in box 136 need not be expanded. That is, the regular expression in box 136 could remain represented by the data associated with the source regular expression. In this example, the data would be "D15.6+". Furthermore, more than one previously defined regular expression can be added in to the box 136. For example, a user could add block 134 to the box 136 to add the associated regular expression, add in operators, or the like In an embodiment, the presented regular expression can be any regular expression. As described above, block 132 had associated alignment and width terms. However, the associated regular expression could have been "(1010000110: "D15.6+")" without one or more of the alignment and width terms.

In another example, a previously defined regular expression could be "((1100000101|1010000110): "K28.5")". This regular expression could be presented as "K28.5". In response to a user input, the regular expression being formed could have the expanded "((1100000101|1010000110): "K28.5")". That is, the regular expression added in need not be limited to a mere sequence of literals, but can include any valid regular expression.

As a regular expression can be any valid regular expression, and these regular expressions can be relatively complex, even more complex regular expressions can be formed, potentially hiding the complexity from a user. For example, as described above, an 8b/10b decoder can be described as a regular expression. Similarly, other encoding schemes can be defined, such as 64b/66b. "8b/10b" could be presented in block 132 and "64b/66b" could be presented in block 134. A user could form a combined decoder for both 8b/10b and 64b/66b encodings. That is, the regular expression could be formed by a user dragging "8b/10b" into the box 136, entering an OR operator "|", and dragging "64b/66b" into the box 136.

Moreover, as the regular expressions added in can be any regular expression, such complex combinations need not be complete for each element. For example, the "8b/10b" regular expression may completely decode an 8b/10b bit stream;

however the "64b/66b" regular expression may only define a portion of the associated encoding scheme. For example, the regular expression for "64b/66b" could be "(10|01)X*64 width 66".

Although a text box has been used as an example of a user interface for the formation of the regular expression, any interface that can allow a user to enter literals, operators, the previously defined regular expressions, or the like can be used in place of or in addition to the box 136.

Figure 9:
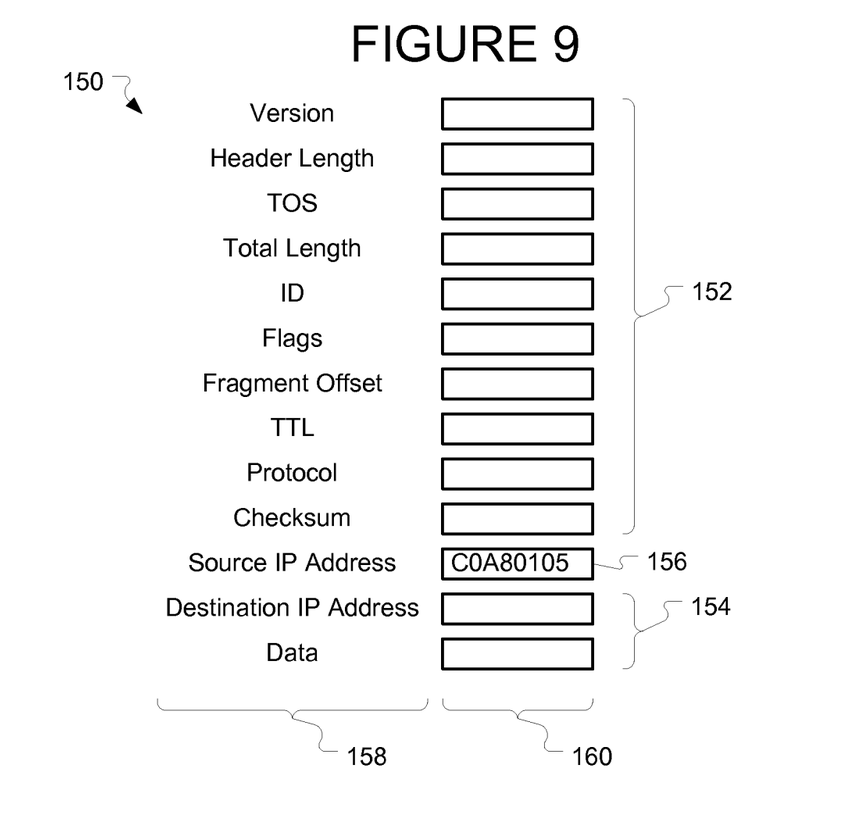
FIG. 9 is another example of a user interface of a test and measurement instrument with a regular expression engine according to an embodiment of the invention.

FIG. 9 is another example of a user interface of a test and measurement instrument with a regular expression engine according to an embodiment of the invention. A presentation 150 of a user interface is illustrated with field descriptions 158 and entry fields 160. In this example, a regular expression for an IP packet is described; however, other formats could be used. A grammar for defining a packet using regular expressions could be:

| | |
|---|---|
| <Packet>: | <BasePacket> |
| | \| <BasePacket> <Alignment> |
| | ; |
| <BasePacket>: | <Field> |
| | \| <Packet> ',' <Field> |
| | ; |
| <Field>: | '[' <RegExpr> ']' ':' ID |
| | ; |

In this example, a previously defined regular expression could be "[0000100000000000], [X*4]:Version, [X*4]:HeaderLength, [X*8]:TOS, [X*16]:TotalLength, [X*16]:ID, [X*3]:Flags, [X*13]:FragmentOffset, [X*8]:TTL, [X*8]:Protocol, [X*16]:Checksum, [X*32]:SourceIPAddr, [X*32]:DestIPAddr, [X*(TotalLength-20)*8]:Data" Here, the TotalLength ID could represent length in bytes. Hence, the amount of bits of the Data field would be TotalLength in bytes—20 header bytes times 8 bits per byte.

In an embodiment, for <Field> portions of the regular expression, corresponding labels and entry fields can be presented through the user interface 14. In this example, a user has left fields 152 and 154 blank and filled in field 156 with a value C0A80105 in hexadecimal, which represents a source IP address of 192.168.1.5. Accordingly, such user inputs can be used to generate a regular expression such as "[0000100000000000 X*16], [X*16]:TotalLength, [X*54 11000000101010000000000100000101 X*32X*(TotalLength-20)*8]". That is, fields 152 and 152 can be compressed if the fields are not filled in, values associated with elements can be added in to modify the regular expression, values can be expanded into bits, or the like.

In an embodiment, the ID parameter of a <Field> can be referenced in other locations of the regular expression. In this example, TotalLength is used in the Data field. In particular, the length of the number of matching bits in the Data field depends on the value of the TotalLength field. In one example, the TotalLength field can be a defined value, similar to the source IP address. In another example, the TotalLength field can be determined from a particular bit sequence being analyzed. That is, if the bits that are beginning to match the TotalLength field of the regular expression reference a value of "120", the number of matching bits in the Data field can be (120−20)*8 or 800 bits. Such a value can change for each application of the regular expression to a different bit sequence, starting location in a bit sequence, or the like.

In an embodiment, the regular expression engine can be configured to apply a regular expression in reverse. For example, a particular alignment sequence in a serial data stream 10 may occur after a bit sequence matching a regular expression. Accordingly, when an alignment sequence is found, the regular expression engine can be applied in reverse from the alignment sequence.

Another embodiment includes computer readable code embodied on a computer readable medium that when executed, causes the computer to perform any of the above-described operations. As used here, a computer is any device that can execute code. Microprocessors, programmable logic devices, multiprocessor systems, digital signal processors, personal computers, or the like are all examples of such a computer. In an embodiment, the computer readable medium can be a tangible computer readable medium that is configured to store the computer readable code in a non-transitory manner.

Although particular embodiments have been described, it will be appreciated that the principles of the invention are not limited to those embodiments. Variations and modifications may be made without departing from the principles of the invention as set forth in the following claims.

What is claimed is:

1. A test and measurement instrument, comprising:
   a user interface; and
   a controller configured to:
      receive a serial bit stream;
      apply a regular expression to the serial bit stream; and
      present acquired data through the user interface in response to the application of the regular expression to the serial bit stream.

2. The test and measurement instrument of claim 1, wherein the controller is further configured to:
   search the serial bit stream using an alignment regular expression of the regular expression; and
   apply a remainder of the regular expression in response to a match in the serial bit stream to the alignment regular expression.

3. The test and measurement instrument of claim 1, wherein the controller is further configured to:
   increment an index referencing the serial bit stream when applying the regular expression to the serial bit stream in response to a width defined by the regular expression.

4. The test and measurement instrument of claim 1, wherein the controller is further configured to:
   apply the regular expression to the serial bit stream using a number of indices referencing the serial bit stream equal to a width of the regular expression; and
   select an index from the indices with a greatest number of matches to the regular expression.

5. The test and measurement instrument of claim 1, further comprising:
   a trigger system configured to generate a trigger signal;
   wherein the controller is further configured to apply the regular expression to the serial bit stream using an index referencing the serial bit stream associated with the trigger signal.

6. The test and measurement instrument of claim 1, wherein the controller is further configured to:
   generate an index referencing the serial bit stream in response to the user interface; and
   apply the regular expression to the serial bit stream using the index.

7. The test and measurement instrument of claim 1, wherein the controller is further configured to:
   associate data of the regular expression to a match of the regular expression in the serial bit stream.

8. The test and measurement instrument of claim 1, wherein:

the user interface is configured to present data of a previously defined regular expression;

the controller is configured to form the regular expression in response to a user input associated with the presented data of the previously defined regular expression.

9. The test and measurement instrument of claim 1, further comprising:

a trigger system configured to trigger an acquisition in response to a match of the regular expression to the serial bit stream.

10. The test and measurement instrument of claim 1, wherein the controller is further configured to:

present data of a previously defined regular expression through the user interface; and form the regular expression in response to a user input associated with the presented data of the previously defined regular expression.

11. The test and measurement instrument of claim 10, wherein the controller is configured to:

receive at least one matching value associated with the previously defined regular expression through the user interface; and add the at least one matching value to the regular expression.

12. The test and measurement instrument of claim 10, wherein the controller is configured to:

form the regular expression from the previously defined regular expression;

receive a value associated with an element of the previously defined regular expression; and modify the regular expression in response to the value.

13. A method for a controller of a test and measurement instrument, the method comprising:

receiving a serial bit stream in the controller;

applying a regular expression to the serial bit stream;

acquiring data in the controller in response to the application of the regular expression to the serial bit stream; and presenting the acquired data through a user interface of the test and measurement instrument.

14. The method of claim 13, further comprising:

searching the serial bit stream using an alignment regular expression of the regular expression; and applying a remainder of the regular expression in response to a match in the serial bit stream to the alignment regular expression.

15. The method of claim 13, further comprising:

incrementing an index referencing the serial bit stream when applying the regular expression to the serial bit stream in response to a width defined by the regular expression.

16. The method of claim 13, further comprising:

applying the regular expression to the serial bit stream using a number of indices referencing the serial bit stream equal to a width of the regular expression; and selecting an index from the indices with a greatest number of matches to the regular expression.

17. The method of claim 13, further comprising:

applying the regular expression to the serial bit stream using an index referencing the serial bit stream associated with a trigger signal.

18. The method of claim 13, further comprising:

generating an index referencing the serial bit stream in response to the user interface; and applying the regular expression to the serial bit stream using the index.

19. The method of claim 13, further comprising:

associating data of the regular expression to a match of the regular expression in the serial bit stream.

20. The method of claim 13, further comprising:

presenting data of a previously defined regular expression; and forming the regular expression in response to a user input associated with the presented data of the previously defined regular expression.

21. The method of claim 13, further comprising:

triggering an acquisition in response to a match of the regular expression to the serial bit stream.

\* \* \* \* \*